United States Patent
Mitra

(10) Patent No.: US 7,406,841 B2
(45) Date of Patent: Aug. 5, 2008

(54) GLASS-CERAMIC PRODUCT WITH VARIABLY ADJUSTABLE ZERO CROSSING OF THE CTE-T CURVE

(75) Inventor: Ina Mitra, Stadecken-Elsheim (DE)

(73) Assignee: Schott Glas, Mainz (DE)

( * ) Notice: Subject to any disclaimer, the term of this patent is extended or adjusted under 35 U.S.C. 154(b) by 324 days.

(21) Appl. No.: 11/168,573

(22) Filed: Jun. 29, 2005

(65) Prior Publication Data

US 2005/0235696 A1 Oct. 27, 2005

Related U.S. Application Data

(62) Division of application No. 10/284,478, filed on Oct. 31, 2002, now abandoned.

(30) Foreign Application Priority Data

Dec. 21, 2001 (DE) ................................ 101 63 597

(51) Int. Cl.
C03B 5/24 (2006.01)
(52) U.S. Cl. ............................. 65/29.1; 65/33.1; 501/2
(58) Field of Classification Search .................. 65/29.1, 65/33.1, 33.8; 264/603; 501/2
See application file for complete search history.

(56) References Cited

U.S. PATENT DOCUMENTS

| | | | |
|---|---|---|---|
| 3,788,865 A | 1/1974 | Babcock et al. | |
| 4,285,728 A | 8/1981 | Babcock et al. | |
| 4,851,372 A * | 7/1989 | Lindig et al. | 501/4 |
| 5,336,643 A * | 8/1994 | Goto et al. | 501/4 |
| 5,446,008 A | 8/1995 | Krolla et al. | |
| 5,591,682 A * | 1/1997 | Goto | 501/4 |
| 6,031,598 A | 2/2000 | Tichenor et al. | |
| 6,048,652 A | 4/2000 | Nguyen et al. | |
| 6,087,280 A | 7/2000 | Beall et al. | |
| 6,362,118 B1 | 3/2002 | Beall et al. | |
| 6,673,729 B2 | 1/2004 | Siebers et al. | |

FOREIGN PATENT DOCUMENTS

DE 19 02 432 9/1970

OTHER PUBLICATIONS

J.W. Berthold III and S. F. Jacobs, "Ultraprecise thermal expansion measurements of seven low expansion materials," Applied Optics, Oct. 1976, pp. 2344-2347, vol. 15, No. 10, XP002276827; p. 2344, Measurement technique, p. 2345, Case 1; p. 2345 Material sutdies—Cer-Vit, fig. 3.

J. Petzoldt and W. Pannhorst, "Chemistry and structure of glass-ceramic materials for high precision optical application," Journal of Non-crystalline Solids, 1991, pp. 191-198, vol. 129, XP002276828, p. 194, Unterer Teil der linken Spalte—oberer Teil der rechten Spalte ("the metastability . . . a more positive CTE value"), fig. 4.

(Continued)

*Primary Examiner*—Steven P. Griffin
*Assistant Examiner*—DeMaris R. Wilson
(74) *Attorney, Agent, or Firm*—Millen, White, Zelano & Branigan, P.C.

(57) ABSTRACT

The present invention relates to a process for producing a glass-ceramic with a defined zero crossing of the CTE-T curve (CTE: coefficient of thermal expansion), and glass-ceramic products produced using the process according to the invention.

10 Claims, 8 Drawing Sheets

Title: Glass-ceramic product with variably adjustable zero crossing of the CTE-T curve
Our ref: P1697 us

OTHER PUBLICATIONS

Davis M J et al., "Thermal expansion and internal quality of a proposed EUVL mask substrate material: Zerodur," Proc. SPIE—Int. Soc. Opt. Eng. (USA), Proceedings of the SPIE—The International Society for Optical Engineering, Nov. 2001, pp. 100-106, vol. 4452, XP002276829, ISSN: 0277-786X, article '2.1.1; fig. 1.

Sarkisov P D, ED—Mazurin 0 V International Commission on Glass, "The Modern State of Technology and Application of Glass-Ceramics," Survey of Contemporary Glass Science and Technology. Leningrad, Jul. 2, vol. Survey Papers. Congress 15, Jul. 3,1989, pp. 411-441, XP000075340, table 2.

SEMI Draft Document 3148 Specification For Extreme Ultraviolet Lithography Mask Substrates, pp. 1-11.

DIN 51 045 Teil Sep. 1, 1989 Preisgr. 7, pp. 1-8, Bestimmung der thermischen Langenanderung fester Korper Grundiagen.

DIN ISO 7991:1997—pp. 1-10, Determination of coefficient of mean linear thermal expansion.

Thermal expansion and length stability of Zerodur in dependance on temperature and time, Otto Lindig and Wolfgang Pannhorst, Applied Optics/vol. 24, No. 20/Oct. 15, 1985, pp. 3330-3334.

* cited by examiner

Zerodur® expansion curve

GLASS-CERAMIC PRODUCT WITH VARIABLY ADJUSTABLE ZERO CROSSING OF THE CTE-T CURVE

This application is a divisional application of U.S. Ser. No. 10/284,478 filed on Oct. 31, 2002, now abandoned.

The present invention relates to a process for producing a glass-ceramic with a defined zero crossing of the CTE-T curve (CTE: coefficient of thermal expansion), and to glass-ceramic products produced using the process according to the invention.

Transparent glass-ceramics with a low coefficient of thermal expansion have long been known in the prior art and are described, for example, in DE 19 02 432 C, U.S. Pat. No. 4,851,372 A and U.S. Pat. No. 5,591,682 A.

By way of example, DE 19 02 432 C relates to a glass-ceramic with a composition range belonging to the $Li_2O$—$Al_2O_3$—$SiO_2$ system, in which composition changes in the crystalline phase during the annealing do not cause any significant change to the expansion coefficient of a glass-ceramic. Specimens which have been ceramicized for a period of 4 to 100 h at temperatures from 750° C. to 870° C. are given as an exemplary embodiment. The mean CTEs of the specimens, which were determined for the temperature intervals [−30° C.;+20° C.] and [+20° C.;+50° C.], were determined with an accuracy of ±0.02×10$^{-6}$/K.

Glass-ceramics are classified by giving the mean CTE$[t_0;t]$ in a temperature interval from $t_0$ to t.

By way of example, Zerodur® is divided into the following three expansion classes, the values indicating the mean CTE [0° C.;50° C.] in a temperature range from 0° C. to 50° C.:

Class 0  0±0.02×10$^{-6}$/K
Class 1  0±0.05×10$^{-6}$/K
Class 2  0±0.10×10$^{-6}$/K However, this specification is no longer sufficient for some modern applications. By way of example, EUV (Extreme UV) lithography requires substrates for masks and reflectors which have a mean CTE in the temperature range from, for example, 19 to 25° C. of less than 0±5 ppb/K and a change in the mean CTE in this temperature range ΔCTE <6 ppb/K.

Hitherto, it has been assumed that the CTE of glass-ceramics cannot be set to more accurate ranges than those described above.

Therefore, the object of the present invention was to provide a process which allows glass-ceramic products which satisfy the requirements listed above to be produced. Furthermore, it is intended to provide glass-ceramic products which are able to satisfy the above specifications.

The above object is achieved by the embodiments described in the claims. In particular, the invention provides a process for producing a glass-ceramic which has a zero crossing of the CTE-T curve at a selected temperature $T_A$±10° C., comprising the steps of providing a glass-ceramic or a green body of a glass-ceramic and ceramicizing in accordance with a ceramicizing program, the determination of which comprises the step of determining the CTE-T curve.

In the prior art, the ceramicizing of a glass-ceramic is generally carried out at temperatures at which the mean CTE substantially does not change. Hitherto, it has been assumed that it is impossible to control the CTE of a glass-ceramic with any greater accuracy.

Surprisingly, it has now been found that the very slight change in the CTE at such ceramicizing temperatures can quite easily be used to set the CTE-T curve to a defined zero crossing.

Thus, if a glass ceramic material is to be produced for an application temperature $T_A$, it is possible to adapt the zero crossing of the CTE-T curve of a given glass ceramic to this application temperature by using the process of the present invention.

Figure 1:
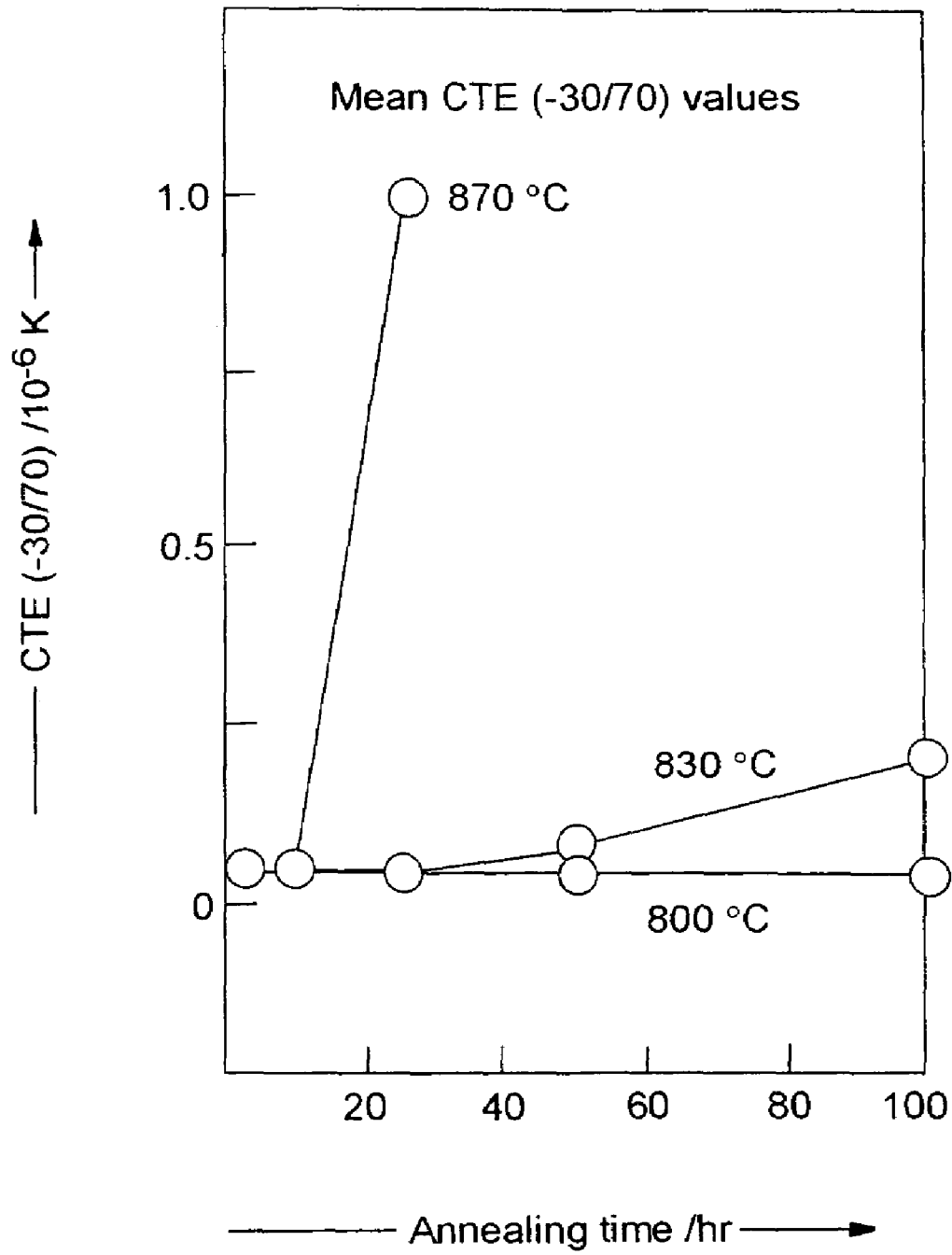
FIG. 1 shows the influence of the ceramicizing temperature on the mean CTE [−30° C.;70° C.].

FIGS. 3 to 7 in each case in Figure a show polynomials which have been laid through measurement points from $\Delta l/l_0$–T measurements on Zerodur® specimens, and in Figure b show CTE-T curves which have been obtained by deriving the polynomials from the respective Figure a. FIG. 8 shows respective diagrams measured at a sample of Zerodur® M.

The process according to the invention is used to produce glass-ceramics with specific thermal or temperature-dependent length-change or expansion properties at a specific application temperature $T_A$.

The term glass-ceramic is understood as meaning inorganic, nonporous materials with a crystalline phase and a vitreous phase, the matrix, i.e. the continuous phase, generally being a glass phase.

Glass-ceramic material is generally produced as follows: suitable raw-materials are melted, refined, homogenized and then hot-formed into a glass blank or green body. The "green body" of a glass-ceramic is understood as meaning a vitreous body which has been melted from a glass-ceramic composition and can be converted into a glass-ceramic.

After the green body has been cooled and annealed, a heat-treatment is carried out, during which the glass is converted into a glass-ceramic by controlled volume crystallization. During this heat treatment, in a first conversion step crystallization nuclei are formed in the glass. These crystallization nuclei can either originate from the glass composition and generate spontaneously or certain compounds such as e.g. $TiO_2$ or $ZrO_2$ in case of Zerodur® can be added -to the glass composition to act as crystallization nuclei. The term crystallization nuclei or crystal nuclei is understood as meaning submicroscopic crystalline aggregates of a characteristic size. In a second conversion step, if appropriate at a slightly higher temperature, crystals or crystallites grow from the crystal nuclei.

The crystalline phrase and the glass phase together provide glass-ceramics with their particular properties.

According to the invention, it is preferable to provide a glass-ceramic with a low mean coefficient of thermal expansion or CTE.

In this context, a "low mean CTE" is to be understood as meaning a value of preferably 0±1.0×10$^{-6}$/K, more preferably 0±0.6×10$^{-6}$/K, which is measured in a temperature range around the application temperature, in particular a mean CTE $[T_A$−100° C.;$T_A$+100° C.], more preferably mean CTE $[T_A$−50° C.;$T_A$+50° C.].

According to the invention, by way of example it is possible to use glass-ceramics with a structure in which the crystal phase or crystalline phase has a negative linear thermal expansion, while that of the vitreous phase or the glass phase is positive. The particular composition of the base glass of the glass-ceramic, a defined crystal nucleation and defined crystallization conditions can then result in a material with an extremely low thermal expansion.

Since the crystal phase of a glass-ceramic essentially determines the expansion characteristics, the expansion coefficient of the material is dependent on the structural state of the crystalline phase. The crystal phase of the glass-ceramic is in turn dependent firstly on the composition and secondly on the ceramicization conditions.

In a new composition, it will generally first of all be necessary to study the way in which the expansion properties are dependent on the ceramicization conditions in the temperature range of the subsequent application temperature $T_A$ of the glass-ceramic. In such a case, the process according to the invention preferably includes the additional step of compiling a $\Delta l/l_0$–T set of curves, in order to draw up the ceramicizing program. A $\Delta l/l_0$–T set of curves is understood as meaning a series of at least two, and preferably more, $\Delta l/l_0$–T curves. It is also recommended to compile a set of curves of this type if the zero crossing of the CTE-T curve is to be set for an application temperature for which a set of curves of this type is not currently in existence.

To draw up a $\Delta l/l_0$–T curve or an expansion curve or to plot the change in length $\Delta l/l_0$ of a specimen against the temperature, it is possible to measure the temperature-dependent change in the length of a specimen from the starting length $l_0$ at the starting temperature $T_0$ to the length $l_t$ at the temperature t. In doing so, it is preferable to select small temperature intervals of, for example, 5° C. or 3° C. to determine a measurement point.

Such measurements may be carried out, for example, by dilatometry, methods, interferometry methods, for example the Fabry-Perot method, i.e. evaluating the shift in the resonance peak of a laser beam which is introduced into the material, or by other suitable methods.

The method which is selected to determine the $\Delta l/l_0$–T measurement points preferably have an accuracy of preferably at least ±0.10 ppm, more preferably of ±0.05 ppm.

Finally, as described below, a polynomial is laid through the measured values obtained by measurement, the $\Delta l/l_0$–T measured values. The measured values, together with the selected polynomial, can be entered into a $\Delta l/l_0$–T diagram. If $\Delta l/l_0$–T measurements from a plurality of specimens are entered into a diagram, the result is a set of curves as shown in FIG. 2.

Figure 2:
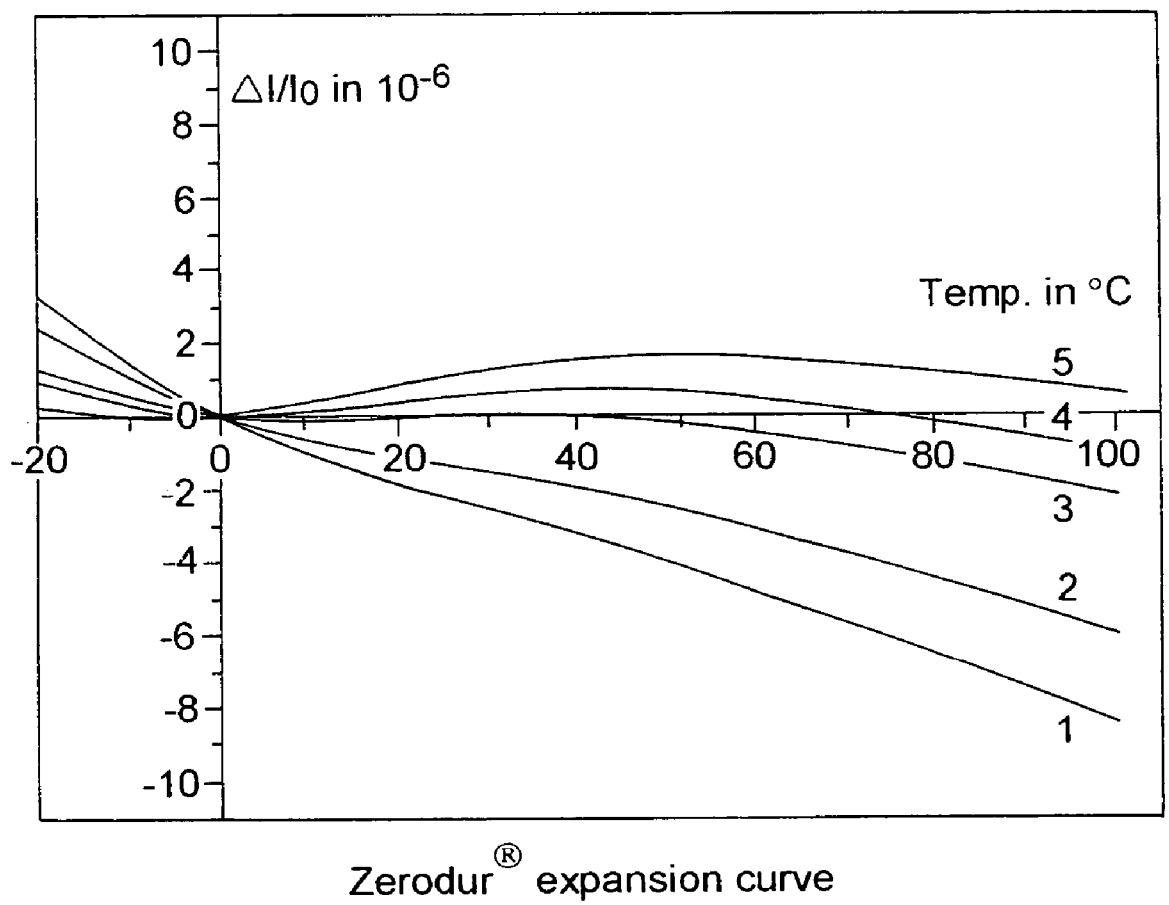
FIG. 2 shows a set of curves for polynomials which have been laid through measurement points from $\Delta l/l_0$–T measurements on various ceramicized Zerodur® specimens.

FIG. 2 shows a set of curves which has been compiled using the method described above for differently ceramicized Zerodur® specimens. In this case, the application temperature $T_A$ of the desired glass-ceramic is to lie in the region of room temperature. Zerodur®0 specimens have been pre-ceramicized until they reach a range in which the mean CTE [0; 50] substantially no longer changes. Then, a plurality of specimens of this pre-ceramicized glass-ceramic were each ceramicized at the same ceramicizing temperature but for different ceramicizing times. Then, the change in length $\Delta l/l_0$ of the specimen in the temperature range from −50° C. to 100° C. was determined, and the values determined were entered into a $\Delta l/l_0$–T diagram and polynomials which match the measured values were laid through the measured values.

To better assess the development of the change in length and to allow better comparison of the polynomials or curves laid through the measured values in the range from 0 to 50° C., the zero crossing of all the curves was set to 0° C. Curve 1 originates from the specimen with the shortest ceramicizing time, which increases through curves 2, 3 and 4 up to curve 5. It is clearly apparent that as the ceramicizing time of the specimen increases, "the curve rotates counterclockwise about the origin" and that the curve changes in the range between 0 and 40° C. from a curve which drops downward toward the right, through a curve which fluctuates around the zero line, to a curve which rises upward to the right. Furthermore, the maximum of the curve, which lies at room temperature, increasingly shifts toward higher temperatures, and the minimum, which lies around 0° C., shifts toward lower temperatures.

Similar results are produced if the glass-ceramic specimens are ceramicized for a constant ceramicizing time but at different ceramicizing temperatures.

Findings of this nature, taken from the set of curves, are used to adapt the ceramicizing program. Since the maxima and minima of the $\Delta l/l_0$–T curve correspond to the zero crossings of the CTE-T curve, it is now possible to derive from the set of curves a conclusion as to whether a longer ceramicizing time or higher a ceramicizing temperature or a shorter ceramicizing time or a lower ceramicizing temperature is required in order to shift a defined zero crossing.

It would also be possible for the process according to the invention to be carried out only by determining a $\Delta l/l_0$–T curve and determining the minima and maxima thereof. However, this corresponds to deriving the curve and is therefore also covered by the present invention.

In the case of glass-ceramics, hitherto the mean CTE for a temperature range has been given and can be determined by means of the following equation (1):

$$CTE\ [t_0;t] = (1/l_0) \times (l_t - l_0)/(t - t_0) = \Delta l/(l_0 \times \Delta) \qquad (1)$$

where $t_0$ is the starting temperature, t is the measurement temperature, $l_0$ is the specimen length at the starting temperature $t_0$, $l_t$ is the specimen length at the temperature t and $\Delta l$ is the corrected change in length of the specimen for temperature change $\Delta t$.

To determine a mean CTE, the length of a specimen of a glass-ceramic is measured at the starting temperature to, the specimen is heated to a second temperature t and the length $l_t$ is measured at this temperature. The mean CTE $[t_0;t]$ for the temperature range $t_0$ to t results from the above formula (1).

According to the invention, this conventional method of determining the mean CTE is unsuitable. The observation of the mean CTE over a temperature interval means that the true CTE at a defined temperature is distorted. A CTE-T curve which fluctuates about the zero line may simulate a low mean CTE, whereas the "true CTE" at the application temperature may lie outside of the specifications.

The "true CTE" at a defined temperature is understood as meaning the value on a CTE-T curve at this temperature.

Therefore, according to the invention, the CTE is determined as a function of the temperature, and the coefficient of (longitudinal) thermal expansion CTE or α(CTE = coefficient of thermal expansion) is defined in accordance with the following formula (2):

$$CTE\ (T) = (1/l_0) \times (\partial l/\partial T) \qquad (2)$$

The process according to the invention comprises the step of determining the CTE-T curve of a glass-ceramic in order to determine a ceramicizing program.

By way of example, a process which comprises the following steps:

providing a green body or a pre-ceramicized glass-ceramic, determining $\Delta l/l_0$–T measurement points in a temperature range $T_A$ of, for example, ±100° C., ±50° C. or ±25° C., matching a polynomial to the $\Delta l/l_0$–T measurement points, and deriving the polynomial to obtain a CTE-T curve can be selected in order to determine the CTE-T curve of a glass-ceramic.

This embodiment is described in more detail below.

First of all, the $\Delta l/l_0$–T measured values of a pre-ceramicized glass-ceramic are determined, as described above.

Then, according to this embodiment of the present invention, an n-th degree polynomial, for example a 4th degree polynomial, is laid through the $\Delta l/l_0$–T measurement points in such a way that the measurement points and polynomial coincide as accurately as possible. $l_t$ is preferable to use a 3rd to 6th degree polynomial. A 3rd degree polynomial is often already sufficiently variable to allow it to be matched with sufficient accuracy to the measured values. Higher degree polynomials, e.g. $8^{th}$ degree polynomials, generally have an "oscillation" which is not generally appropriate for the measured values.

Furthermore, it is preferable for the polynomial to be .selected appropriately in particular for the temperature range $T_A \pm 100°$ C., more preferably $T_A \pm 50°$ C.

The CTE-T curve can be determined by deriving the selected polynomial.

FIGS. 3b to 8b show the curves in which the CTE is plotted against the temperature (CTE-T curve) and which have been determined by the above-described derivation of polynomials or curves laid through $\Delta l/l_0$–T measurement points as shown in FIGS. 3a to 8a.

Figure 3A:
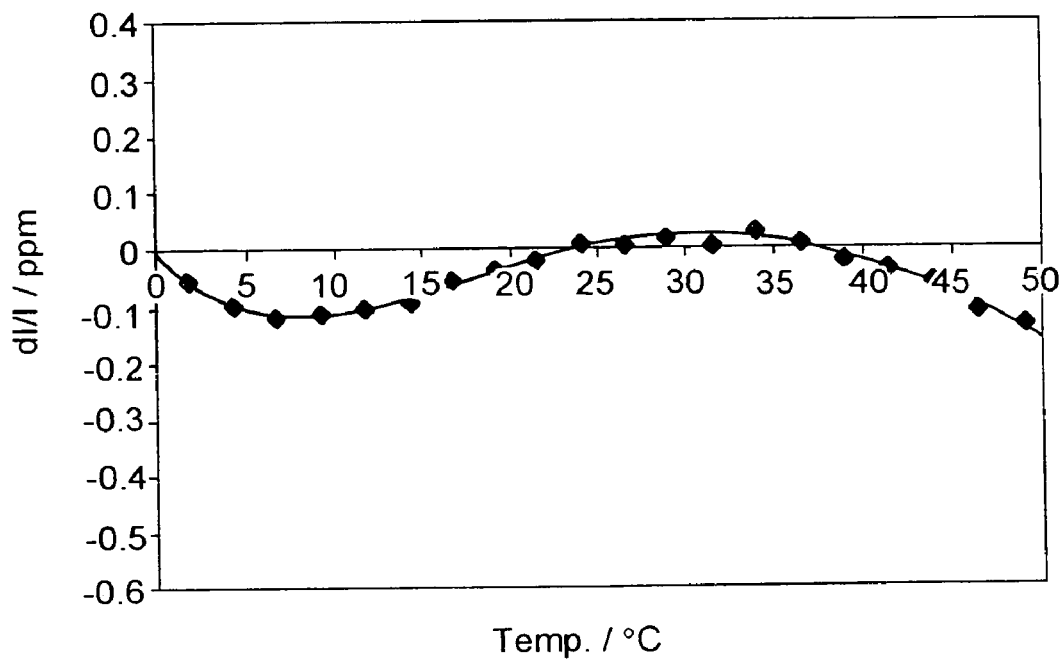

FIG. 3a shows the $\Delta l/l_0$–T measurement points of curve 3 from FIG. 2 and the polynomial laid through these measurement points on a different scale. A derivation of the polynomial results in the CTE-T curve shown in FIG. 3b, which has zero crossings-of the CTE-T curve at approx. 8° C. and approx. 31° C.

If the zero crossing of the CTE-T curve is not yet at the desired temperature, the ceramicizing program is adapted, for example by the findings which have been obtained from the set of curves.

By way of example, a longer ceramicizing time and/or higher ceramicizing temperatures or a shorter ceramicizing time and/or lower temperatures are selected. In certain cases, the zero crossing of the CTE-curve can also be shifted into the desired range by further post-ceramicizing.

Figure 3B:
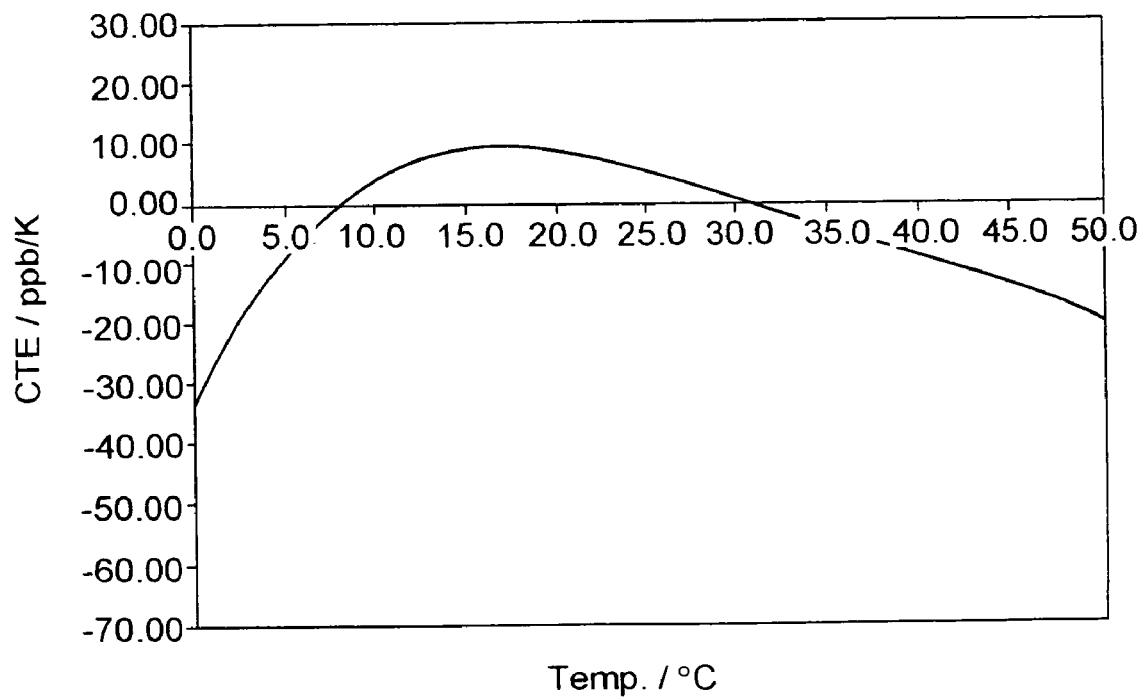
Figure 4A:
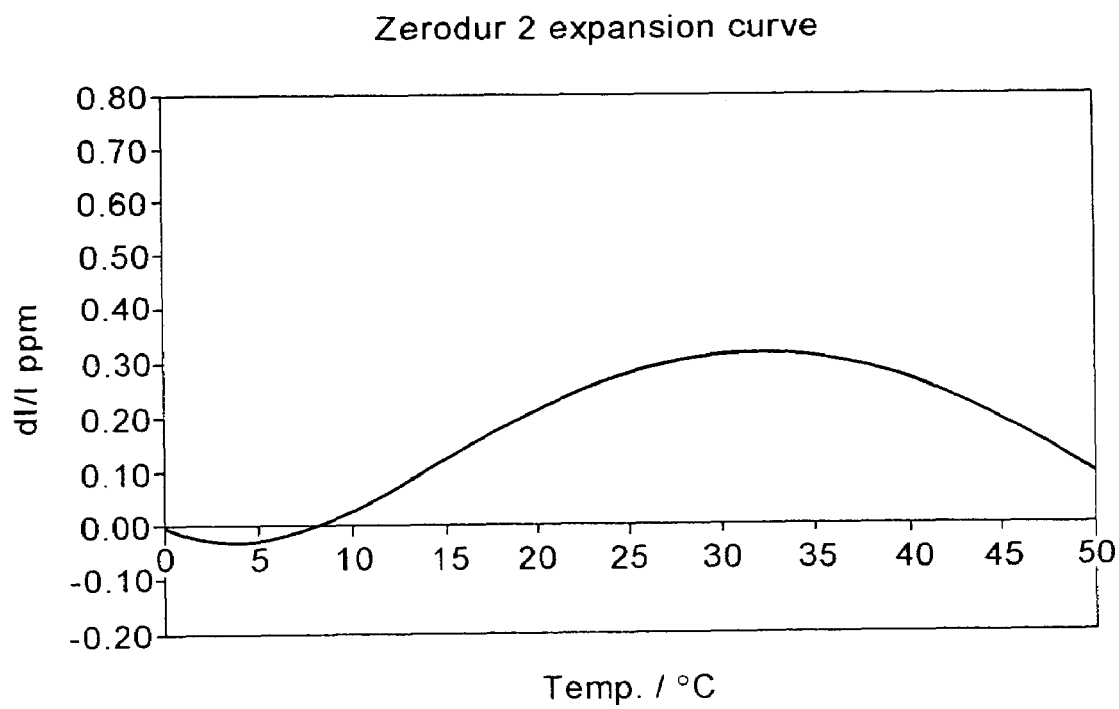
Figure 4B:
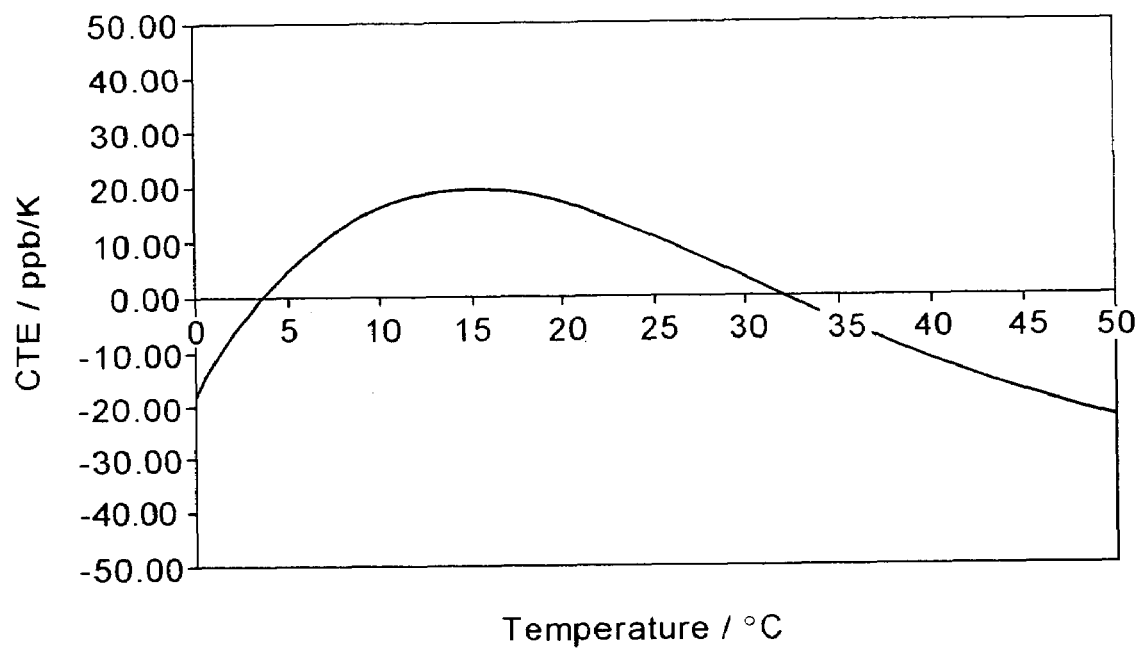
Figure 5A:
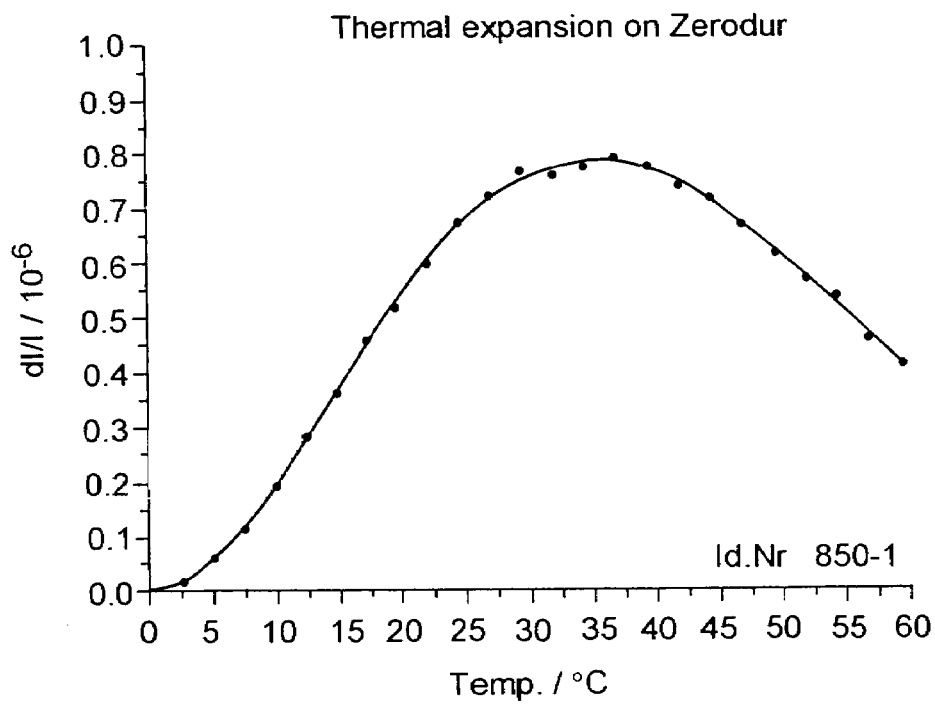
Figure 5B:
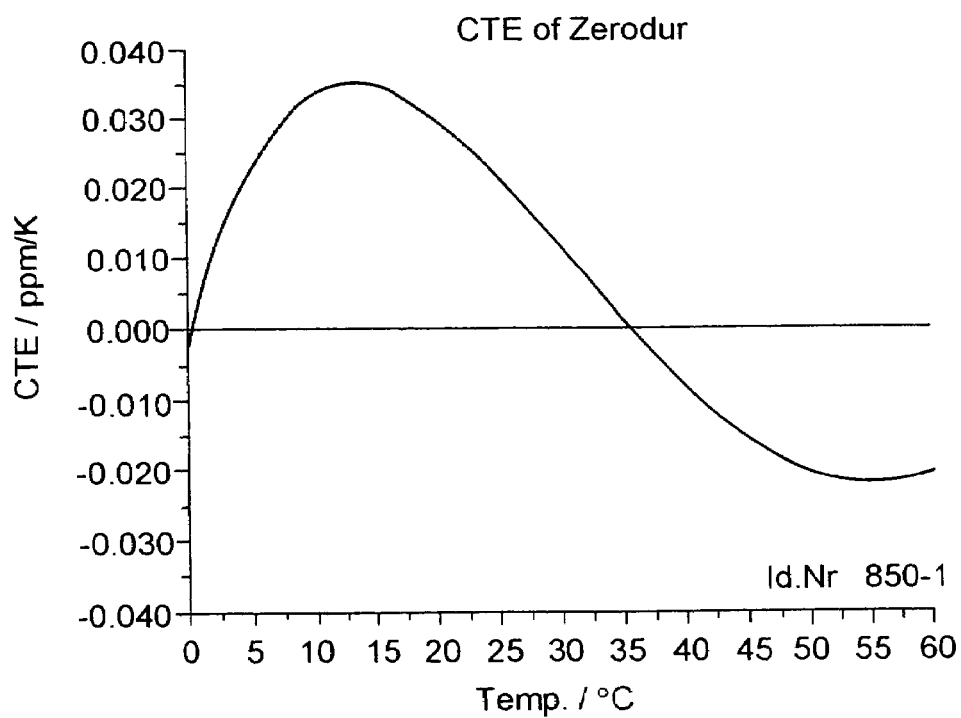

FIGS. 4a and 5a show $\Delta l/l_0$–T measurement points or polynomials laid through these measurement points and the respective derivations of these polynomials in CTE-T curves in FIGS. 4b and 5b, which compared to FIG. 3b have zero crossings which have been shifted as a result, of a longer ceramicizing time. It was possible to shift the zero crossing at lower temperatures from 8° C. (FIG. 3b) through 4° C. (FIG. 4b) to 1° C. (FIG. 5b). It was possible to shift the zero crossing of the CTE-T curve at approximately 31° C. (FIG. 3b) through 33° C. (FIG. 4b) to 36° C. (FIG. 5b).

To obtain a glass-ceramic of-the same composition with a zero crossing at room temperature, in this case it is necessary to start from a specimen which has been pre-ceramicized to a lesser degree.

Figure 6A:
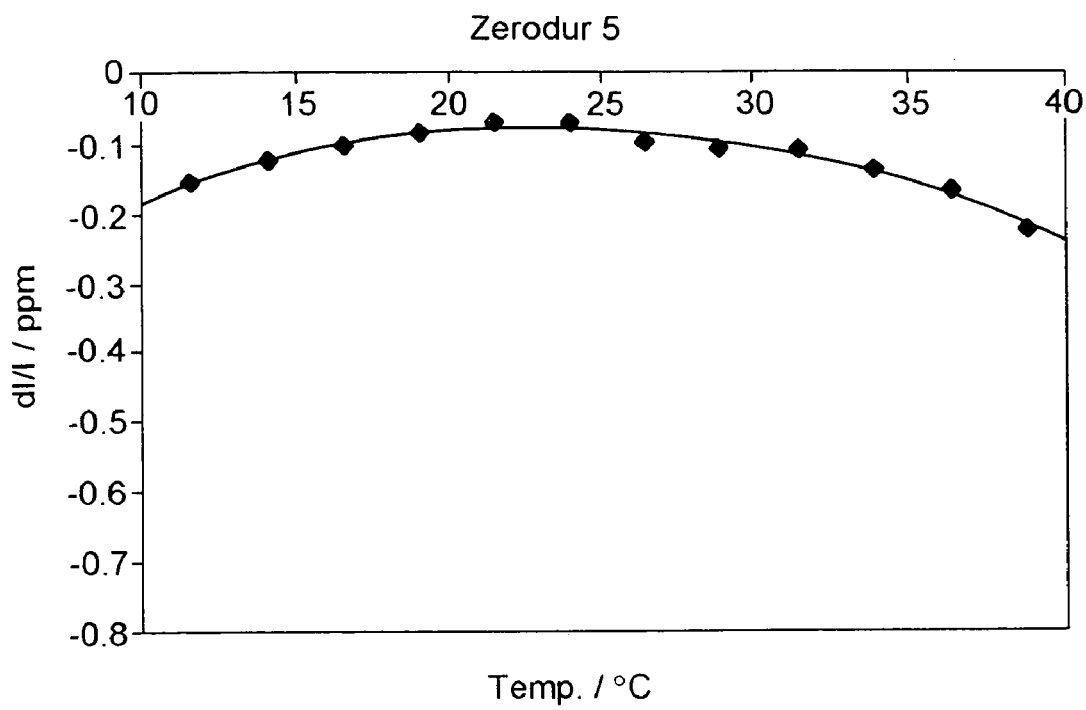
Figure 6B:
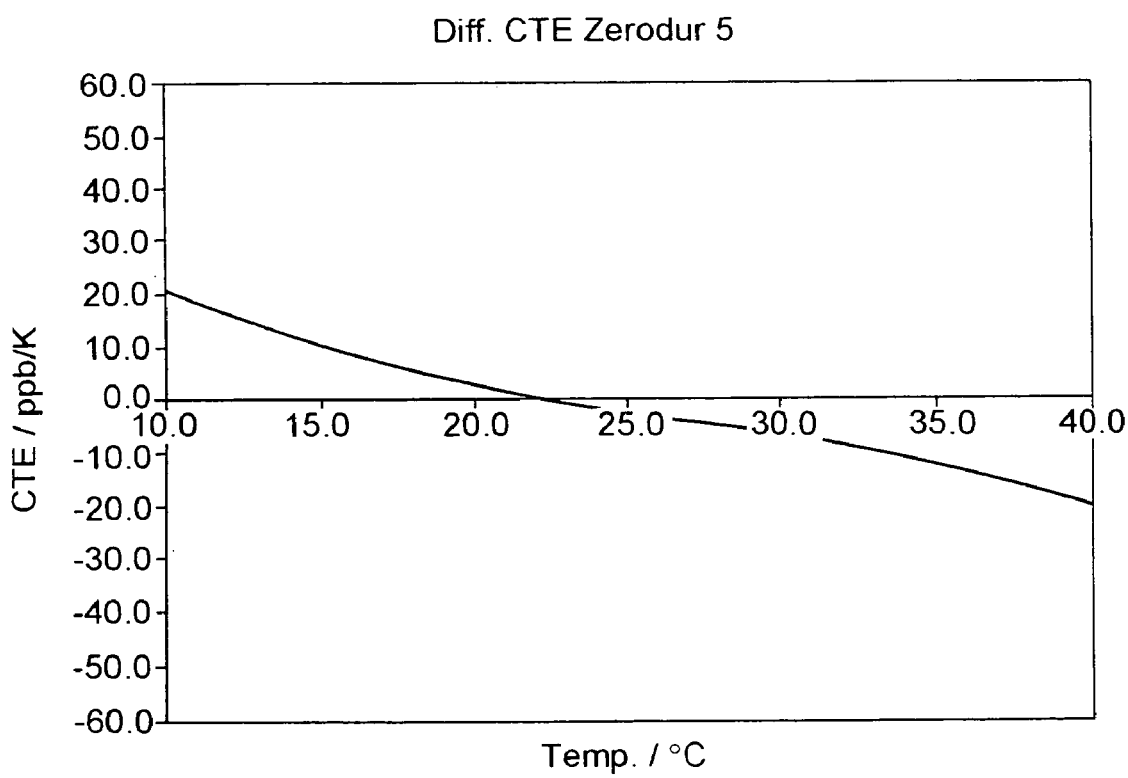

FIG. 6a/b shows results of measurements carried out on a glass-ceramic which is particularly suitable for an application range around room temperature. In this case, a pre-ceramicized glass-ceramic which had a mean CTE [0;50] of $-0.1 \times 10^{-6}$K and a $\Delta l/l_0$–T curve which approximately corresponded to the curve 1 from FIG. 1, was used. The $\Delta l/l_0$ measurement points shown in FIG. 6a were obtained after ceramicizing. After derivation of the polynomial laid through these measurement points it was confirmed that the zero crossing of the CTE-T curve lies at approximately 22.5° C. Furthermore, in the range between 19 and 25° C. the deviation of the CTE from the value 0 is extremely small, in this temperature range lying between approximately +4 ppb/K at 19° C. and approximately −2 ppb/K at 25° C.

Figure 7A:
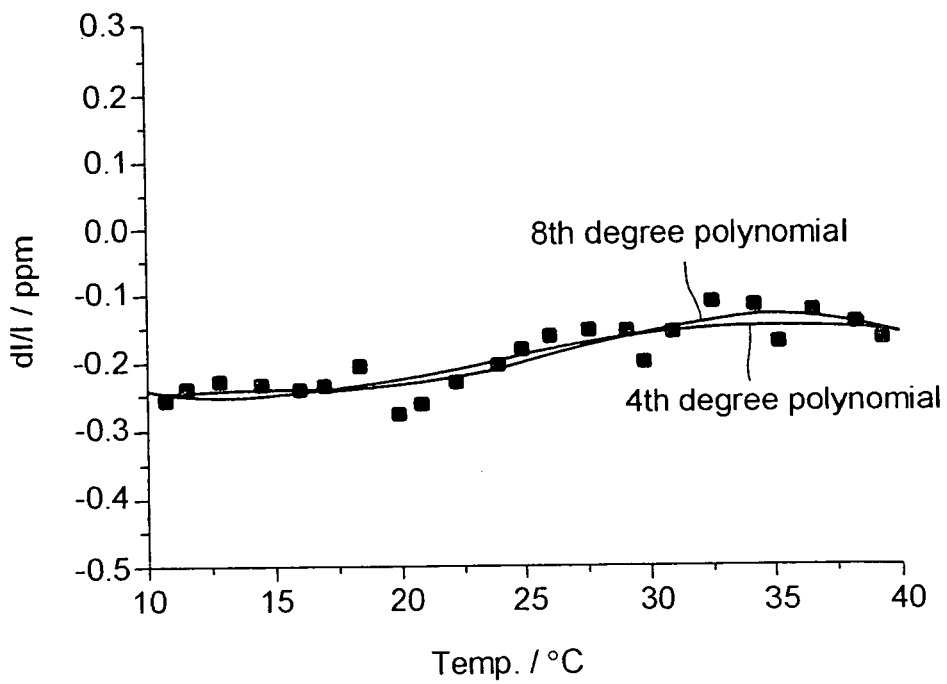
Figure 7B:
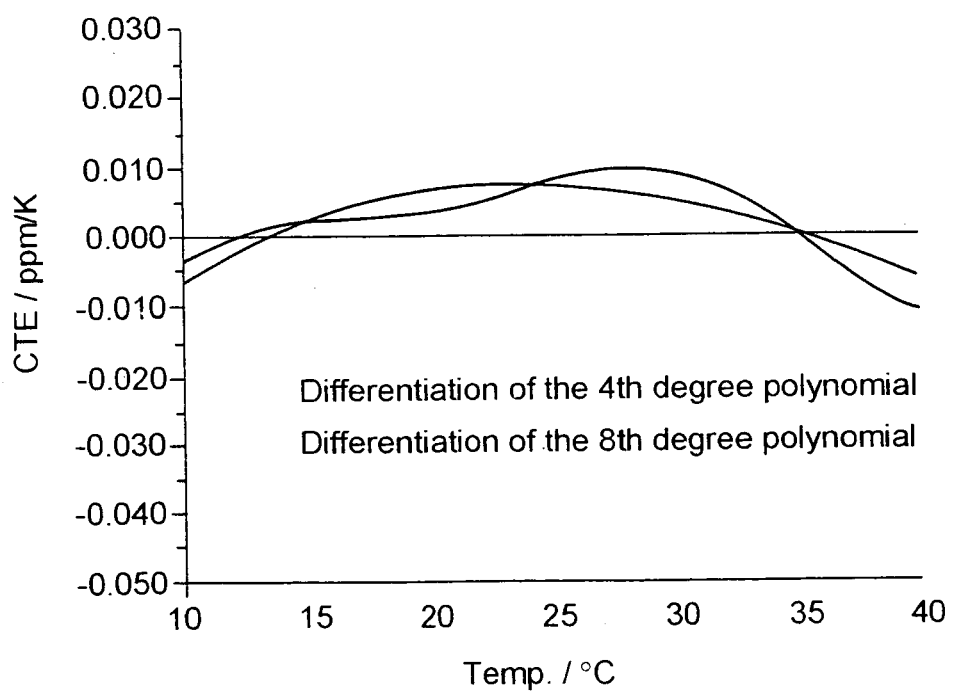
Figure 8A:
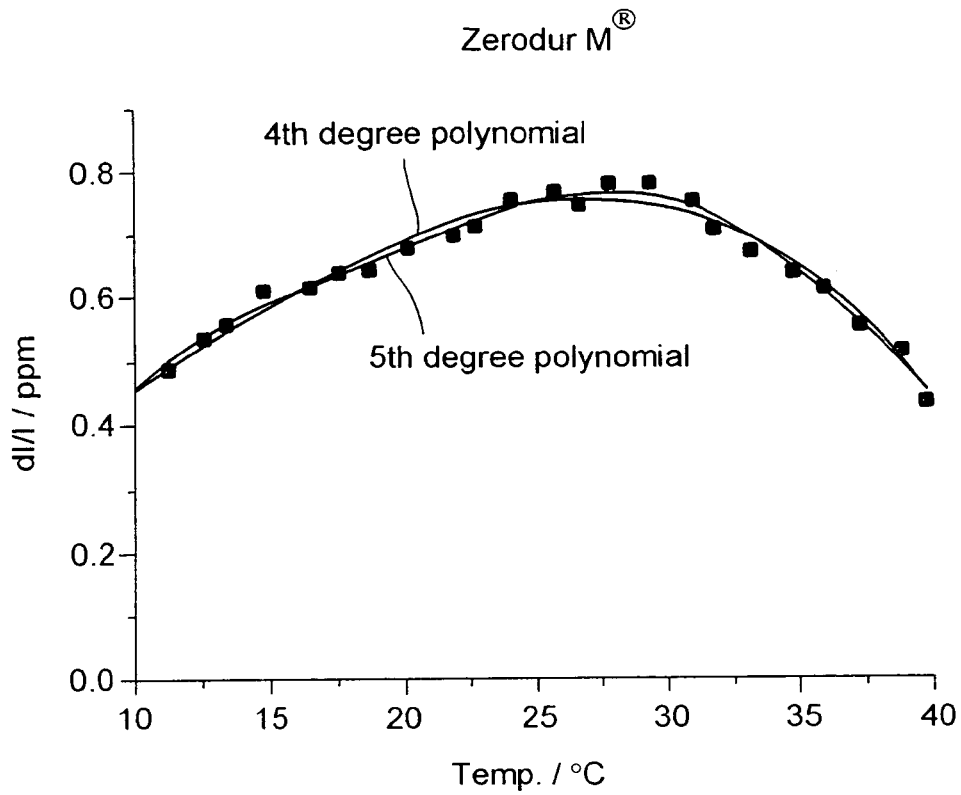
Figure 8B:
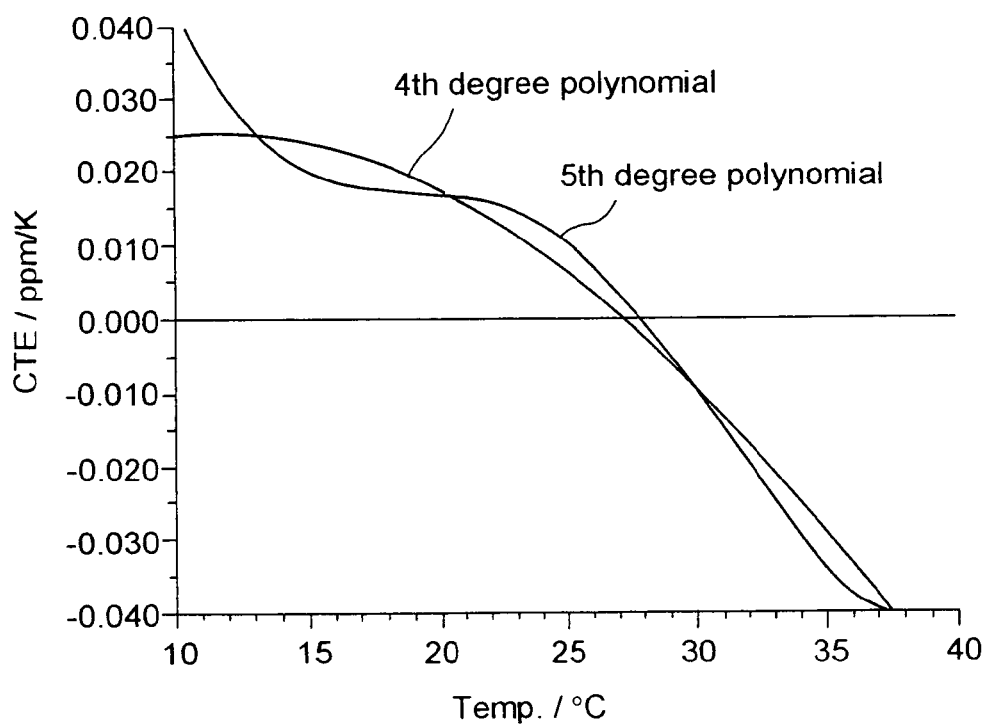

FIGS. 7 and 8 show the effects on the CTE-T curve if different degree polynomials are laid through the $\Delta l/l_0$ measurement points and these polynomials are then converted into CTE-T curves by derivation. In FIG. 7, the first zero crossing of the CTE-T curve at approx. 13° C. shifts by approx. 2° C. to approx. 15° C., the second zero crossing of the CTE-T curve being at approx. 35° C. for both polynomials selected. As a result, the zero crossing of the CTE-T curve in FIG. 8 is shifted by only 1° C., from 27° C. to 28° C. Furthermore, FIG. 8 shows that the present invention is not limited to Zerodur®, since it relates to a sample of Zerodur® M.

Therefore, even-when a slightly different polynomial which is laid through the $\Delta l/l_0$ measurement points is selected, the-accuracy of a zero crossing of the CTE-T curve of ±10° C., preferably ±7° C., more preferably ±5° C., particularly preferably +3° C., can still be-maintained without problems.

The ceramicizing temperature is dependent on the glass-ceramic composition which is used in each case. Ceramicizing temperatures of known glass-cerarmics are described in the prior art and are known to the person skilled in the art (cf. for example "Low Thermal Expansion Glass Ceramics", Schott Series on Glass and Glass Ceramics, Science, Technology, and Applications, Hans Bach (Ed.), Springer-Verlag Berlin Heidelberg, 1995).

According to the invention, it is preferable, where Zerodur® is used, to use ceramicizing temperatures from 700 to 830° C., more preferably 750 to 820° C., in the process according to the invention.

FIG. 1 shows the change in the mean CTE at relatively high ceramicizing temperatures. As can be seen from FIG. 1, as the ceramicizing time increases, the mean CTE rises steeply at temperatures above 830° C. At these high temperatures, the solid solutions with a high quartz content are converted into keatite solid solutions, which also leads to an opacity in the previously transparent glass-ceramic and to a significant change in the mean CTE.

In the case of Zerodur M®, the preferred ceramicizing temperatures are slightly lower, preferably in a range from 700 to 830° C., more preferably 700 to 780° C.

Ceramicizing temperatures of 750 to 840° C., in particular 770 to 800° C., are preferred for the glass-ceramic Clearzeram®.

In the process according to the invention, the glass-ceramic is preferably ceramicized at a temperature at which the mean CTE in a range from $T_A - 50°$ C. to $T_A + 50°$ C., i.e. the mean CTE $[(T_A - 50°$ C.$);(T_A + 50°$ C.$)]$, preferably $T_A - 25°$ C. to $T_A + 25°$ C., i.e. the mean CTE $[(T_A - 25°$ C.$);(T_A + 25°$ C.$)]$, substantially does not change. In this context, the term "a temperature at which the mean CTE substantially does not change" means that the mean CTE of a glass-ceramic before annealing changes by at most $0.1 \times 10^{-6}$/K as a result of annealing at this temperature for a period of at least 50 h, more preferably at least 100 h.

In general, it is also possible to use lower temperatures, provided that there is still little change in the mean CTE at these temperatures.

In general, longer ceramicizing times are required at lower temperatures. If, on the other hand, relatively high ceramicizing temperatures are selected, lying at or above the maximum temperature mentioned above, the ceramicizing time is relatively short and in limit conditions the process is difficult to control.

The ceramicizing may be carried out over a period of several hours to several months.

According to the invention, the ceramicizing of a green body may take place either in a plurality of stages or in a single ceramicizing operation. By way of example, a glass-ceramic which has already been pre-ceramicized can be ceramicized further in a second step or a plurality of further steps in order to effect the fine-adjustment of the zero crossing of the CTE-T curve. However, if the ceramicizing operation is sufficiently well known, it is also possible that a single ceramicizing step from the green body to the glass-ceramic with a set zero crossing of the CTE-T curve may be sufficient.

According to one embodiment of the present invention, a transparent glass-ceramic is used. The transparency means that many properties of a glass-ceramic of this type, in particular of course, its optical properties, can be assessed more successfully.

It is preferable for a glass-ceramic from the $Li_2O$—$Al_2O_3$—$SiO_2$ system to be provided for the process according to the invention.

Transparent glass-ceramics with a low coefficient of thermal expansion are known in this system, and commercially available products such as Zerodur®, Zerodur M® (both from SCHOTT Glas) and Clearzeram® (Ohara) may be mentioned by way of example. These glass-ceramics usually contain approximately 50 to 80% of solid solutions with a high quartz content, also known as β eucryptite solid solutions, as the main crystal phase. This crystallization product is a meta-stable phase which, depending on the crystallization conditions, changes its composition and/or structure or is converted into a different crystal phase. The solid solutions with a high quartz content have a thermal expansion which is very low or even falls as the temperature rises.

In some glass-ceramics, such as for example Zerodur®, it was established that the CTE is dependent on the cooling program. The CTE may change significantly if the cooling from temperatures above 320° C. is not carried out at the same cooling rate as the initial cooling rate. Therefore, if such a glass-ceramic is used it is preferred to control the cooling rate.

Furthermore, the present invention relates to a glass-ceramic product, the CTE-T curve of which has a zero crossing at a temperature $T_A \pm 10°$ C., preferably $\pm 7°$ C., more preferably $\pm 5°$ C., particularly preferably $\pm 3°$ C. $T_A$ denotes the application temperature, i.e. the temperature to which the glass-ceramic is exposed during use.

According to the preferred embodiment of the present invention, the application temperature $T_A$ of the glass-ceramic lies in a temperature range from 0° C. to 100° C.

The glass-ceramic product according to the invention-preferably comprises a glass-ceramic composition and properties as described above in connection with the description of the process.

According to the invention, the change in length of the glass-ceramic product according to the invention at application temperatures preferably results substantially only from reversible length changes.

Setting the zero crossing of the CTE-T curve to the application temperature means that the glass-ceramic product according to the invention, when used with slight deviations from the application temperature, has only a minimal true CTE, i.e. a CTE which differs only slightly from 0, and therefore a minimal length expansion, which only increases slowly at increasing distance from the application temperature. However, since such relatively substantial deviations from the application temperature do not generally occur in processes with controlled process conditions, at least while the process is being carried out, for such applications only the region around the application temperature is of significance, and the inventive effect brings its full weight to bear.

If, on the other hand, only the mean CTE of a glass-ceramic product is set, the CTE curve in the application range may differ according to the particular batch, and the true CTE may disadvantageously be relatively far away from the zero line precisely at the application temperature.

The process according to the invention is preferably used to produce glass-ceramic products which are used in microlithography, metrology, for example for final dimensions, and/or in astronomy, for example as substrate for a reflector.

Depending on the use of the glass-ceramic product according to the invention, the application temperature $T_A$ may lie in different temperature ranges. By way of example, for applications in EUV microlithography and metrology, temperatures in the region of room temperature are typical, whereas in astronomy even temperatures well below zero are not unusual.

Furthermore, the present invention relates to a substrate for, in particular, EUV lithography, which comprises a-glass-ceramic with a low expansion coefficient, the CTE-T curve of the glass-ceramic having a zero crossing at a temperature $T_A$. The temperature $T_A$ preferably lies in a range from 0 to 50° C., more preferably in a range from 10 to 40° C., particularly preferably in a range from 19 to 31° C. Substrates of this type are preferably used as substrates for reflectors and/or masks or mask blanks for EUV lithography.

EXAMPLE

A pre-ceramicized Zerodur® specimen with a mean CTE [0;50] of $-0.1 \times 10^{-6}$/K and approximately the $\Delta l/l_0$ curve 1 from FIG. 2 was ceramicized for 60 h at a maximum temperature of 810° C. The result was a glass-ceramic having the expansion properties shown in FIGS. 3a and 3b.

The preceding examples can be repeated with similar success by substituting the generically or specifically described reactants and/or operating conditions of this invention for those used in the preceding examples.

The entire disclosure of all applications, patents and publications, cited above and below, and of corresponding German Application No. 101 63 597.4-45, filed Dec. 21, 2001 is hereby incorporated by reference.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A process for producing a glass-ceramic which has a zero crossing of the CTE-T curve at a selected temperature $T_A \pm 10°$ C., comprising providing a glass-ceramic or a green body of a glass-ceramic and ceramicizing in accordance with a ceramicizing program, determination of which comprises determining the CTE-T curve, wherein a) the determination of the CTE-T curve comprises providing a green body or a pre-ceramicized glass-ceramic, determining $\Delta l/l_0$–T measurement points for the glass-ceramic in a temperature range $T_A \pm 50°$ C., matching a polynomial to the $\Delta l/l_0$–T measurement points, and deriving the polynomial to obtain a CTE-T curve;

or b) the zero crossing of the CTE-T curve is set at $T_A \pm 7°$ C.;

or c) the zero crossing of the CTE-curve is set at $T_A \pm 5°$ C.;

or d) the glass-ceramic is ceramicized in at least two ceramicizing steps.

2. The process as claimed in claim 1, in which a $\Delta l/l_0$–T set of curves is compiled in order to determine the ceramicizing program.

3. The process as claimed in claim 1, in which the determination of the CTE-T curve comprises the following steps:
   providing a green body or a pre-ceramicized glass-ceramic,
   determining $\Delta l/l_0$–T measurement points for the glass-ceramic in a temperature range $T_A \pm 50°$ C.
   matching a polynomial to the $\Delta l/l_0$–T measurement points, and
   deriving the polynomial to obtain a CTE-T curve.

4. The process as claimed in claim 1, in which the zero crossing of the CTE-T curve is set at $T_A \pm 7°$ C.

5. The process as claimed claim 1, in which the zero crossing of the CTE-curve is set at $T_A \pm 5°$ C.

6. The process as claimed in claim 1, in which a glass-ceramic belonging to the $Li_2O$—$Al_2O_3$—$SiO_2$ system is provided.

7. The process as claimed in claim 1, in which ceramicizing is carried out at a temperature at which the mean CTE $[T_A-50;T_A+50]$ substantially does not change.

8. The process as claimed in claim 1, in which a glass-ceramic with a mean CTE $[(T_A-50° C.);(T_A+50° C.)]$ of at most $1.0 \times 10^{-6}/K$ is provided.

9. The process as claimed in claim 1, in which the glass-ceramic is ceramicized in at least two ceramicizing steps.

10. The process as claimed in claim 1, in which the glass-ceramic of a, b, or c is ceramicized from the green body in one ceramicizing step.

\* \* \* \* \*